(12) United States Patent
Totani

(10) Patent No.: US 11,824,325 B2
(45) Date of Patent: Nov. 21, 2023

(54) LIGHT-EMITTING APPARATUS AND LIGHT-EMITTING ELEMENT HOUSING

(71) Applicant: NGK SPARK PLUG CO., LTD., Nagoya (JP)

(72) Inventor: Shingo Totani, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 142 days.

(21) Appl. No.: 17/463,714

(22) Filed: Sep. 1, 2021

(65) Prior Publication Data

US 2022/0077652 A1 Mar. 10, 2022

(30) Foreign Application Priority Data

Sep. 8, 2020 (JP) ................................. 2020-150782

(51) Int. Cl.
*H01S 5/06* (2006.01)
*H01S 5/0225* (2021.01)
*H01S 5/00* (2006.01)

(52) U.S. Cl.
CPC .......... *H01S 5/0611* (2013.01); *H01S 5/0087* (2021.01); *H01S 5/0225* (2021.01)

(58) Field of Classification Search
CPC .... H01S 5/0611; H01S 5/0087; H01S 5/0225; H01S 5/02208; H01S 5/02255; H01S 5/02257; H01S 5/02345; H01S 5/4037
See application file for complete search history.

(56) References Cited

U.S. PATENT DOCUMENTS

| | | | |
|---|---|---|---|
| 2010/0295438 A1* | 11/2010 | Ott | .......................... F21V 13/14 |
| | | | 313/46 |
| 2012/0087123 A1 | 4/2012 | Nagai | |
| 2015/0062943 A1* | 3/2015 | Takahira | ................... F21V 9/30 |
| | | | 362/510 |
| 2018/0309263 A1* | 10/2018 | Auen | ................... H01S 5/02212 |
| 2018/0316160 A1 | 11/2018 | Raring et al. | |
| 2019/0170314 A1* | 6/2019 | Lenef | ...................... F21S 43/26 |
| 2019/0324359 A1* | 10/2019 | Shimizu | ............. G03B 21/2006 |
| 2020/0227890 A1* | 7/2020 | Chen | ................... H01S 5/02461 |

FOREIGN PATENT DOCUMENTS

| | | |
|---|---|---|
| JP | 2010-506379 A | 2/2010 |
| JP | 2015-022954 A | 2/2015 |
| JP | 2015-065144 A | 4/2015 |

OTHER PUBLICATIONS

Japan Patent Office, Office Action (Notification of Reasons for Refusal) issued in corresponding Application No. JP 2020-150782, dated Mar. 14, 2023.

* cited by examiner

*Primary Examiner* — Xinning(Tom) Niu

(74) *Attorney, Agent, or Firm* — Stites & Harbison, PLLC; Jeffrey A. Haeberlin

(57) ABSTRACT

A multilayer wiring substrate includes a first wiring substrate including a plurality of stacked layers made of a thermo setting resin and having a wiring layer formed between each adjacent layer of the layers in a state in contact with the adjacent layers, a second wiring substrate made of a ceramic, and a joining layer disposed between a back surface of the first wiring substrate and a front surface of the second wiring substrate and configured to join the first wiring substrate and the second wiring substrate to each other, wherein at least a surface of the joining layer adjacent to the second wiring substrate is made of a thermo plastic resin.

20 Claims, 10 Drawing Sheets

LIGHT-EMITTING APPARATUS AND LIGHT-EMITTING ELEMENT HOUSING

TECHNICAL FIELD

The present invention relates to a light-emitting apparatus and to a light-emitting element housing.

DESCRIPTION OF THE RELATED ART

Background Art

A light-emitting apparatus including a wavelength conversion body for converting the wavelength of light has been known (for example, see PTL 1). In a light-emitting apparatus disclosed in PTL 1, the interior of a housing that houses a light-emitting element is filled with a wavelength conversion substance. In a light-emitting apparatus disclosed in PTL 2, a light-emitting element is disposed on a sloping inner wall of a housing which houses the light-emitting element and a wavelength conversion body.

CITATION LIST

Patent Literature

PTL 1: Japanese Kohyo Patent Publication No. 2010-506379
PTL 2: US Patent Application Publication No. 2018/0316160

SUMMARY OF INVENTION

Technical Problem

In the light-emitting apparatus disclosed in PTL 1, light emitted from the light-emitting element is absorbed by the wavelength conversion body and the light-emitting element due to multiple reflection within the housing, leading to a possible decrease in optical output. Also, since the intensity of excitation light of the wavelength conversion body and the intensity of emitted light increase and decrease due to the multiple reflection of light within the housing, the chromaticity of white light emitted from the light-emitting apparatus may become instable.

In a light-emitting apparatus disclosed in PTL 2, the light-emitting element disposed on the sloping inner wall emits light toward the wavelength conversion body disposed on the bottom surface, and light reflected by the wavelength conversion body is emitted through an upper portion of the housing. In this structure, the light reflected by the wavelength conversion body is partially absorbed by electrodes and a semiconductor layer constituting the light-emitting element and by gold wires provided for electrifying the light-emitting element, which may result in a decrease in optical output.

The present invention has been accomplished so as to solve the above-described problem, and an object of the present invention is to prevent a decrease in output power of light emitted from a light-emitting apparatus and stabilize the chromaticity of the light.

The present invention has been accomplished so as to solve the above-described problem, and can be realized in the following aspects.

Solution to Problem (1) An aspect of the present invention is a light-emitting apparatus which comprises a housing having a bottom portion, a side wall portion connected to the bottom portion, and a lid portion connected to the side wall portion and facing the bottom portion; a light-emitting element which emits light; and a wavelength conversion body which converts a wavelength of the light emitted from the light-emitting element and emits light having a converted wavelength.

The bottom portion has a central portion and an outer edge portion when viewed from a side where the lid portion is present, the central portion projecting toward the lid portion in relation to the outer edge portion. The bottom portion has a flat top surface on the central portion, the top surface facing the lid portion. The bottom portion has a sloping surface around the top surface.

The light-emitting element is disposed on the sloping surface, and the wavelength conversion body is disposed on the top surface and emits light toward the lid portion.

The lid portion has a transparent portion and a reflecting portion. The transparent portion is at least a part of a portion facing the wavelength conversion body and allowing the light emitted from the wavelength conversion body to pass through the transparent portion. The reflecting portion is a portion different from the transparent portion and specularly reflecting the light emitted from the light-emitting element so that the light impinges on the wavelength conversion body.

In this configuration, the wavelength conversion body is disposed on the top surface of the central portion of the bottom portion, the central portion projecting in relation to the outer edge portion. The light-emitting element is disposed on the sloping surface formed around the top surface. Also, in the lid portion, the transparent portion is formed in at least a part of the portion facing the wavelength conversion body, and the reflecting portion is formed in a portion other than the transparent portion. This reflecting portion specularly reflects the light emitted from the light-emitting element so that the light impinges on the wavelength conversion body. Therefore, in the light-emitting apparatus having this configuration, the light reflected by the reflecting portion of the lid portion can be caused to impinge on the wavelength conversion body. Thus, unlike a light-emitting apparatus in which multiple reflection of light emitted from the light-emitting element occurs in the housing, in the light-emitting apparatus having this configuration, the intensity of excitation light of the wavelength conversion body and the intensity of emitted light are prevented from increasing and decreasing. As a result, the light-emitting apparatus having this configuration can suppress a decrease in output power of light emitted from the light-emitting apparatus and stabilize the chromaticity of the light.

(2) In the light-emitting apparatus of the aspect, the lid portion may include a plate-shaped member which allows the light emitted from the wavelength conversion body to pass therethrough, and a film member provided on a surface of the plate-shaped member, the surface facing the wavelength conversion body, the film member specularly reflecting the light emitted from the light-emitting element, whereby a portion of the plate-shaped member where the film member is provided serves as the reflecting portion, and a portion of the plate-shaped member where the film member is not provided serves as the transparent portion.

In this configuration, a portion of the plate-shaped member where the film member is provided functions as the reflecting portion. Meanwhile, a portion of the plate-shaped member where the film member is not provided functions as the transparent portion. Namely, in the present configuration, the entirety of a portion of the lid portion, other than the film member functioning as the reflecting portion, functions as the transparent portion. Therefore, the lid portion prevents confinement of light within the housing. As a result, it is possible to further suppress a decrease in output power of light output from the light-emitting apparatus having this configuration.

(3) In the light-emitting apparatus of the aspect, as viewed in a facing direction in which the bottom portion and the lid portion face each other, the wavelength conversion body may be disposed on the side where the lid portion is present in relation to the light-emitting element.

In this configuration, the light-emitting element is located on the bottom portion side in relation to the wavelength conversion body. Therefore, the light emitted from the wavelength conversion body is prevented from being absorbed by the light-emitting element and wires, such as gold wires, which connect the light-emitting element and electrodes. As a result, it is possible to further suppress a decrease in output power of light output from the light-emitting apparatus having this configuration.

(4) In the light-emitting apparatus of the aspect, a plurality of light-emitting elements may be disposed, and at least two of the light-emitting elements may be disposed in such a manner that, as viewed from the side where the lid portion is present, the wavelength conversion body is located between the two light-emitting elements, and optical axes of light beams emitted from the two light-emitting elements do not overlap on the wavelength conversion body.

In this configuration, since light beams emitted from the plurality of light-emitting elements impinge on the wavelength conversion body at dispersed positions, heat generation of the wavelength conversion body due to incidence of light is suppressed. Since the wavelength conversion body does not generate heat excessively, a decrease in the conversion efficiency of the wavelength conversion body can be suppressed.

(5) In the light-emitting apparatus of the aspect, a line normal to a reflecting surface of the reflecting portion may incline in relation to a facing direction, in which the bottom portion and the lid portion face each other, so that the line normal to the reflecting surface extends toward the wavelength conversion body.

In this configuration, since the normal line of the reflecting surface of the reflecting portion inclines to extend toward the wavelength conversion body, the optical axis of reflection light from the reflecting portion becomes closer to parallel to the top surface. In the light-emitting apparatus having this configuration, as compared with the case where the reflection portion is formed on a surface parallel to the top surface, the reflection portion can be disposed at a position which is shifted further from the center of the wavelength conversion body toward the outer edge portion side. As a result, the area of the transparent portion of the lid portion which the wavelength conversion body faces increases, and therefore, it is possible to further suppress a decrease in output power of light from the light-emitting apparatus having this configuration.

(6) In the light-emitting apparatus of the aspect, the reflecting portion may be formed of a metal.

In this configuration, since the reflecting portion is formed of a metal, production of the reflecting portion is easy.

(7) The light-emitting apparatus of the aspect may further comprise a reflecting plate disposed on the top surface of the bottom portion, wherein, as viewed from the side where the lid portion is present, the reflecting plate is disposed to surround a circumference of the wavelength conversion body.

In this configuration, even when the light emitted from the wavelength conversion body is reflected by the reflecting portion toward the bottom portion side, the light is reflected again by the reflecting plate toward the lid portion side. As a result, the amount of light absorbed within the housing decreases, and therefore, a decrease in output power of light emitted from the light-emitting apparatus can be suppressed further.

(8) Other aspect of the present invention is a light-emitting element housing for housing a light-emitting element which emits light, and a wavelength conversion body which converts a wavelength of the light emitted from the light-emitting element and emits light having a converted wavelength.

The light-emitting element housing has a bottom portion, a side wall portion connected to the bottom portion, and a lid portion connected to the side wall portion and facing the bottom portion.

The bottom portion has a central portion and an outer edge portion when viewed from a side where the lid portion is present, the central portion projecting toward the lid portion in relation to the outer edge portion. The bottom portion has a flat top surface on the central portion, the top surface facing the lid portion. The bottom portion has a sloping surface around the top surface. The bottom portion has a light-emitting element disposing region on the sloping surface where the light-emitting element is disposed. The bottom portion has a wavelength conversion body disposing region on the top surface where the wavelength conversion body is disposed.

The lid portion has a transparent portion and a reflecting portion. The transparent portion is at least a part of a portion facing the wavelength conversion body disposing region and allowing the light emitted from the wavelength conversion body disposed in the wavelength conversion body disposing region to pass through the transparent portion. The reflecting portion is a portion different from the transparent portion and specularly reflecting the light emitted from the light-emitting element disposed in the light-emitting element disposing region so that the light impinges on the wavelength conversion body disposed in the wavelength conversion body disposing region.

In this configuration, the wavelength conversion body disposing region where the wavelength conversion body is disposed is formed on the top surface of the central portion of the bottom portion, the central portion projecting in relation to the outer edge portion. The light-emitting element disposing region where the light-emitting element is disposed is formed on the sloping surface formed around the top surface. Also, in the lid portion, the transparent portion is formed in at least a part of the portion facing the wavelength conversion body disposing region, and the reflecting portion is formed in a portion different from the transparent portion. This reflecting portion specularly reflects the light emitted from the light-emitting element disposed in the light-emitting element disposing region so that the light impinges on the wavelength conversion body. Therefore, in the light-emitting element housing having this configuration, the light emitted from the light-emitting element disposed in the light-emitting element disposing region can be reflected by the reflecting portion of the lid portion so that the light impinges on the wavelength conversion body disposed in the wavelength conversion body disposing region. Thus, unlike a light-emitting apparatus in which multiple reflection of light emitted from the light-emitting element occurs in the housing, in a light-emitting apparatus in which the light-emitting element housing having this configuration is used, the intensity of excitation light of the wavelength conversion body and the intensity of emitted light are prevented from increasing and decreasing. As a result, the light-emitting element housing having this configuration can suppress a decrease in output power of light emitted from the light-emitting element housing and stabilize the chromaticity of the light.

Notably, the present invention can be realized in various forms. For example, the present invention can be realized as a light-emitting apparatus, a light-emitting element housing, a light-emitting device, a lighting apparatus, an automotive lamp, components including these, and methods for manufacturing these.

DESCRIPTION OF EMBODIMENTS

First Embodiment

Figure 1:
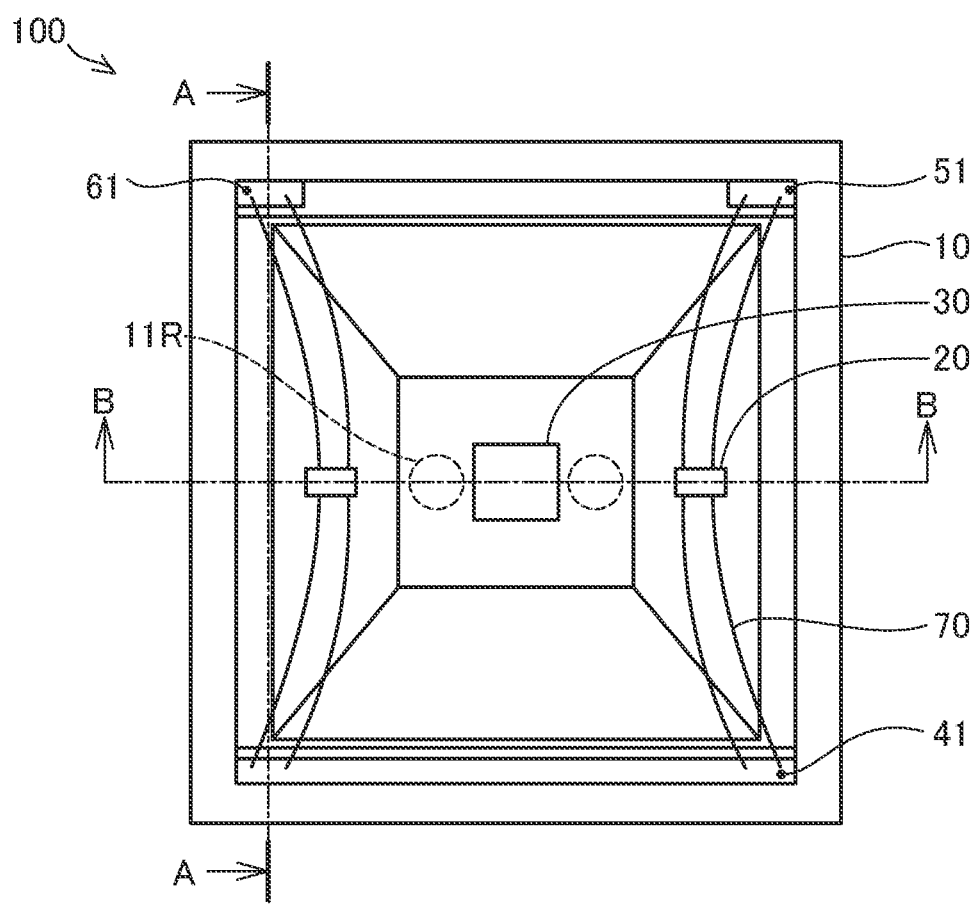
FIG. 1 is an explanatory view of a light-emitting apparatus according to a first embodiment of the present invention.
Figure 1:
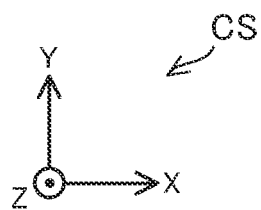
Figure 2:
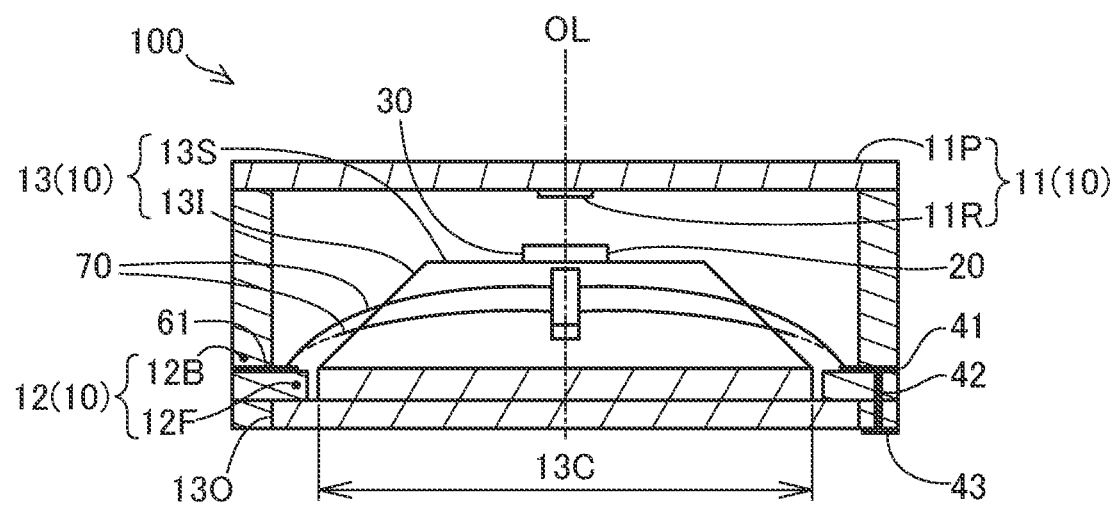
FIG. 2 is another explanatory view of the light-emitting apparatus according to the first embodiment of the present invention.
Figure 2:
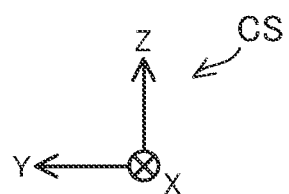
Figure 3:
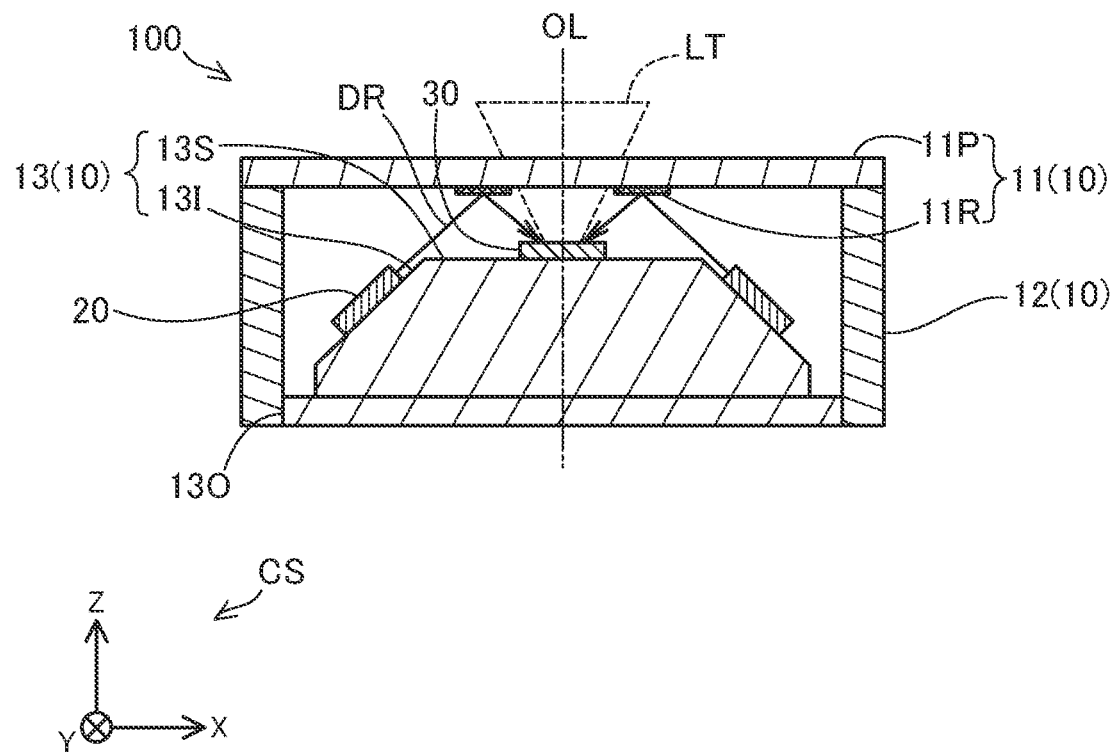
FIG. 3 is still another explanatory view of the light-emitting apparatus according to the first embodiment of the present invention.

FIGS. 1 to 3 are explanatory views of a light-emitting apparatus 100 according to a first embodiment of the present invention. The light-emitting apparatus 100 of the present embodiment outputs white light by converting the wavelength of blue light emitted from a semiconductor laser (LD: Laser Diode) by using a fluorescent body (for example, YAG fluorescent body) serving as an optical wavelength conversion member. FIG. 1 shows a schematic top view of the light-emitting apparatus 100 in a state in which its lid portion 11 is removed. Notably, the details of the lid portion 11 will be described later. FIG. 2 shows a schematic sectional view of the light-emitting apparatus 100 taken along line A-A of FIG. 1 and viewed from a negative direction side of an X-axis. FIG. 3 shows a schematic sectional view of the light-emitting apparatus 100 taken along line B-B of FIG. 1.

As shown in FIG. 1, the light-emitting apparatus 100 of the present embodiment includes two light-emitting elements 20 each of which is composed of a semiconductor laser (emission wavelength: 440 to 460 nm) and which emit light; a housing (light-emitting element housing) 10 which houses the light-emitting elements 20; a fluorescent body (a wavelength conversion body) 30 for converting the wavelength of light emitted from the light-emitting elements; a first wiring conductor 41; a second wiring conductor 51; a third wiring conductor 61; and four gold wires 70 for establishing connections between the wiring conductors 41, 51, and 61 and the light-emitting elements 20. Notably, the orthogonal coordinate system CS shown FIG. 1 is composed of an X-axis, a Y-axis, and a Z-axis, which are orthogonal to one another, and corresponds to the orthogonal coordinate systems CS shown in FIG. 2 and subsequent figures.

As shown in FIGS. 2 and 3, the housing 10 has a bottom portion 13, a side wall portion 12 connected to the bottom portion 13, and the lid portion 11 connected to the side wall portion 12 and facing the bottom portion 13. The bottom portion 13 is formed of Cu (copper). As shown in FIG. 2, the bottom portion 13 has a central portion 13C and an outer edge portion 13O. The central portion 13C, which is located on the side toward a center axis OL in relation to the outer edge portion 13O when viewed from the lid portion 11 side (the positive direction side of the Z-axis), protrudes toward the lid portion 11. Notably, the center axis OL is parallel to the Z-axis extending through the centroid of the bottom portion 13. The central portion 13C of the bottom portion 13 has a flat top surface 13S facing the lid portion 11 and sloping surfaces 131 formed around the top surface 13S. In the present embodiment, the top surface 13S is formed as a surface parallel to an XY plane. The sloping surfaces 131 are connected to the outer edge of the top surface 13S and slope so that the sloping surfaces 131 descend toward the negative direction side of the Z-axis as departing from the center axis OL.

In the present embodiment, the side wall portion 12 is formed of $Al_2O_3$ (alumina), which is a ceramic material. As shown in FIGS. 1 to 3, the side wall portion 12 has a side wall main body portion 12B and a flange portion 12F. The side wall main body portion 12B has a shape formed by removing, from an approximately cuboidal member, a cuboidal portion whose center of gravity coincides with the center axis OL (FIGS. 2 and 3) parallel to the direction of the Z axis. The flange portion 12F extends from the side wall main body portion 12B toward the center axis OL. The wiring conductors 41, 51, and 61 are formed on a surface of the flange portion 12F on the positive direction side of the Z-axis. A surface of the flange portion 12F on the negative direction side of the Z-axis is joined, by using a silver (Ag) brazing material, to a surface of the bottom portion 13 on the positive direction side of the Z-axis.

The lid portion 11 includes a plate-shaped member 11P and film members 11R. The plate-shaped member 11P allows light emitted from the fluorescent body 30 to pass therethrough. The film members 11R specularly reflect light emitted from the light-emitting elements 20. The plate-shaped member 11P is a plate-shaped member having rectangular surfaces parallel to the XY plane. A reflection prevention film including an $SiO_2$ layer and a $TiO_2$ layer is formed on the entire opposite surfaces of the plate-shaped member 11P by means of vapor deposition. A peripheral portion of the plate-shaped member 11P is joined to the side wall main body portion 12B of the side wall portion 12 by using AuSn solder. On a portion of the plate-shaped member 11P, which portion is joined to the side wall portion 12 by using AuSn solder, Cr (50 nm), Ni (100 nm), and Au (500 nm) are deposited through pattern vapor deposition. The lid portion 11, the bottom portion 13, and the side wall portion 12, which are joined together, form a space inside the housing 10 in which the light-emitting elements 20, etc. are housed. The plate-shaped member 11P is formed of a material which allows passage of light therethrough, such as borosilicate glass or sapphire.

The film members 11R are formed of, for example, a metal such as Al (aluminum). In the present embodiment, the film members 11R are disposed on a surface of the plate-shaped member 11P, the surface facing the fluorescent body 30. As indicated by broken lines in FIG. 1, the film members 11R have a circular shape along a surface parallel to the XY plane. In the schematic top view of FIG. 1, of the components of the light-emitting apparatus 100, the plate-shaped member 11P is omitted.

The light-emitting elements 20 are joined to the sloping surfaces 131 of the bottom portion 13 by using AuSn solder in such a manner that the light emitted from each of the light-emitting elements 20 impinges on the corresponding film member 11R of the lid portion 11 as indicated by an optical axis DR shown in FIG. 3. The fluorescent body 30 is joined to the top surface 13S of the bottom portion 13 by using AuSn solder. In the present embodiment, as viewed in the Z axial direction, which is the direction in which the bottom portion 13 and the lid portion 11 face each other, the fluorescent body 30 is located on the side where the lid portion 11 is present (the positive direction side of the Z-axis) in relation to the light-emitting elements 20. The fluorescent body 30 converts blue light emitted from the light-emitting elements 20 to white light and emits the white light LT. As indicated by a broken line in FIG. 3, the white light LT passes through the light-transmissible plate-shaped member 11P, and is emitted to the outside of the housing 10. In the present embodiment, portions where the film members 11R are provided function as reflecting portions for causing the light emitted from the light-emitting elements 20 to propagate toward the fluorescent body 30 as a result of specular reflection. The remaining portion of the plate-shaped member 11P where the film members 11R are not provided functions as a transparent portion which allows the light emitted from the fluorescent body 30 to pass therethrough.

As shown in FIG. 2, the light-emitting apparatus 100 includes a via conductor 42 electrically connected to the first wiring conductor 41 and a back side electrode 43 electrically connected to the via conductor 42. The first wiring conductor 41 is a wiring pattern formed on a surface of the flange portion 12F of the side wall portion 12, the surface being located on the positive direction side of the Z-axis. The via conductor 42 is charged into a through hole which penetrates the side wall portion 12 in the direction of the Z axis. The back side electrode 43 is an electrode formed on a surface of the side wall portion 12, the surface being located on the negative direction side of the Z-axis. Like the first wiring conductor 41, the second wiring conductor 51 and the third wiring conductor 61 are also connected to unillustrated via conductors and unillustrated electrodes. By means of Au wire bonding, the gold wires 70 are provided between the wiring conductors 41, 51, and 61 and the light-emitting elements 20 so as to establish electrical connections between the wiring conductors 41, 51, and 61 and the light-emitting elements 20.

As described above, the light-emitting apparatus 100 of the present embodiment includes the light-emitting elements 20 which emit light, the housing 10 which houses the light-emitting elements 20, and the fluorescent body 30 which converts the wavelength of the light emitted from the light-emitting element 20. The bottom portion 13 is configured such that its central portion 13C has the flat top surface 13S facing the lid portion 11 and the sloping surfaces 131 formed around the top surface 13S. The light-emitting elements 20 are disposed on the sloping surfaces 131 of the bottom portion 13, and the fluorescent body 30 is disposed on the top surface 13S of the bottom portion 13. In the lid portion 11, the plate-shaped member 11P serving as a transparent portion is located in a region which faces the fluorescent body 30, and the film members 11R serving as reflecting portions are located on portions of the plate-shaped member 11P. The film members 11R of the lid portion 11 specularly reflect the light emitted from the light-emitting elements 20 so that the light impinges on the fluorescent body 30. Therefore, in the light-emitting apparatus 100 of the present embodiment, the light reflected by the film members 11R of the lid portion 11 can be caused to impinge on the fluorescent body 30. Thus, unlike a light-emitting apparatus in which multiple reflection of the light emitted from the light-emitting elements 20 occurs in the housing 10, in the light-emitting apparatus 100 of the present embodiment, the intensity of excitation light of the fluorescent body 30 and the intensity of emitted light are prevented from increasing and decreasing. As a result, in the light-emitting apparatus 100 of the present embodiment, it is possible to suppress a decrease in output power of light emitted from the light-emitting apparatus 100 and stabilize the chromaticity of the light.

Also, in the present embodiment, the portions of the plate-shaped member 11P where the film members 11R are provided function as reflecting portions for specularly reflecting the light emitted from the light-emitting elements 20 so that the light impinges on the fluorescent body 30. Meanwhile, the remaining portion of the plate-shaped member 11P where the film members 11R are not provided functions as a transparent portion through which the light emitted from the fluorescent body 30 passes. Namely, in the present embodiment, the entirety of the remaining portion (portion other than the portions where the film members 11R functioning as reflecting portions are provided) of the lid portion 11 functions as a transparent portion. Therefore, the lid portion 11 prevents confinement of light within the housing 10. As a result, it is possible to further suppress a decrease in output power of the white light LT output from the light-emitting apparatus 100.

Also, in the present embodiment, as viewed in the Z axial direction, which is the direction in which the bottom portion 13 and the lid portion 11 face each other, the fluorescent body 30 is disposed on the lid portion 11 side (the positive direction side of the Z-axis) in relation to the light-emitting elements 20. Namely, in the light-emitting apparatus 100 of the present embodiment, the light-emitting elements 20 are located on the bottom portion 13 side in relation to the fluorescent body 30. Therefore, the white light LT emitted from the fluorescent body 30 are prevented from being absorbed by the light-emitting elements 20 and the gold wires 70. As a result, it is possible to further suppress a decrease in output power of the white light LT output from the light-emitting apparatus 100.

Also, since the film members 11R functioning as reflecting portions in the present embodiment are formed of a metal, production of the reflecting portions is easy.

First Modification of First Embodiment

Figure 4:
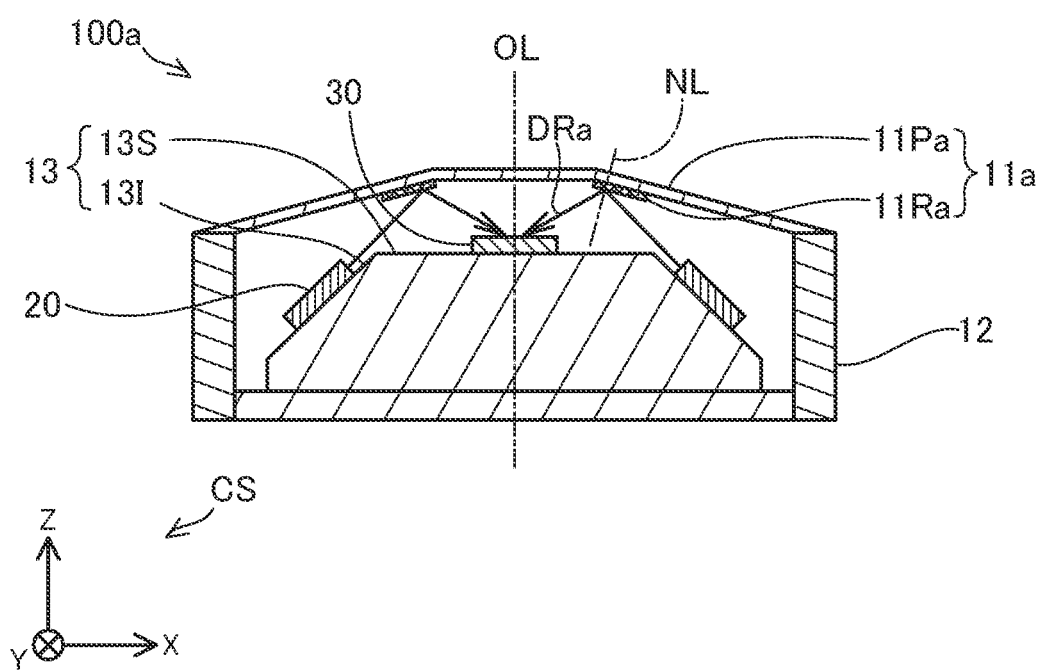
FIG. 4 is an explanatory view of a light-emitting apparatus according to a first modification of the first embodiment.

FIG. 4 is an explanatory view of a light-emitting apparatus 100a of a first modification of the first embodiment.

The light-emitting apparatus 100a shown in FIG. 4 differs from the light-emitting apparatus 100 of the first embodiment in the point that the shape of a lid portion 11a differs from the shape of the lid portion 11 of the light-emitting apparatus 100. The light-emitting apparatus 100a is identical with the light-emitting apparatus 100 of the first embodiment in terms of other shapes, etc. Therefore, only shapes, etc. different from those of the first embodiment will be described, and shapes, etc. identical with those of the first embodiment will not be described repeatedly. FIG. 4 shows a schematic sectional view of the light-emitting apparatus 100a of the first modification which is taken along line B-B and corresponds to the schematic sectional view of FIG. 3 showing the cross section of the light-emitting apparatus 100.

As shown in FIG. 4, the lid portion 11a includes a plate-shaped member 11Pa having bent portions, and film members 11Ra joined to a surface of the plate-shaped member 11Pa, the surface being located on the bottom portion 13 side. The plate-shaped member 11Pa of the first modification slopes from a region where the plate-shaped member 11Pa is joined to the side wall portion 12 in such a manner that the plate-shaped member 11Pa ascends toward the positive direction side of the Z-axis as approaching the center axis OL. In the vicinity of the center axis OL, the plate-shaped member 11Pa has a surface which is parallel to the top surface 13S of the bottom portion 13. The film members 11Ra are joined to the sloping portion of the plate-shaped member 11Pa. Namely, the normal line NL of the reflecting surface of each film member 11Ra inclines in relation to the direction (the direction of the Z axis) in which the bottom portion 13 and the lid portion 11a face each other so that the normal line NL extends toward the fluorescent body 30.

As described above, the normal line NL of the reflecting surface of each film member 11Ra in the first modification of the first embodiment inclines in relation to the direction in which the bottom portion 13 and the lid portion 11a face each other so that the normal line NL extends toward the fluorescent body 30. Therefore, the direction of the optical axis DRa of reflection light from each film member 11Ra becomes closer to a direction (horizontal direction) parallel to the XY plane. In this case, as compared with the case where film members are formed on a surface parallel to the XY plane, the film members 11Ra can be disposed at positions which are more remote from the center axis OL. As a result, the area of a portion of the lid portion 11a which the fluorescent body 30 faces increases, and therefore, it is possible to further suppress a decrease in output power of the white light LT.

Second Modification of First Embodiment

Figure 5:
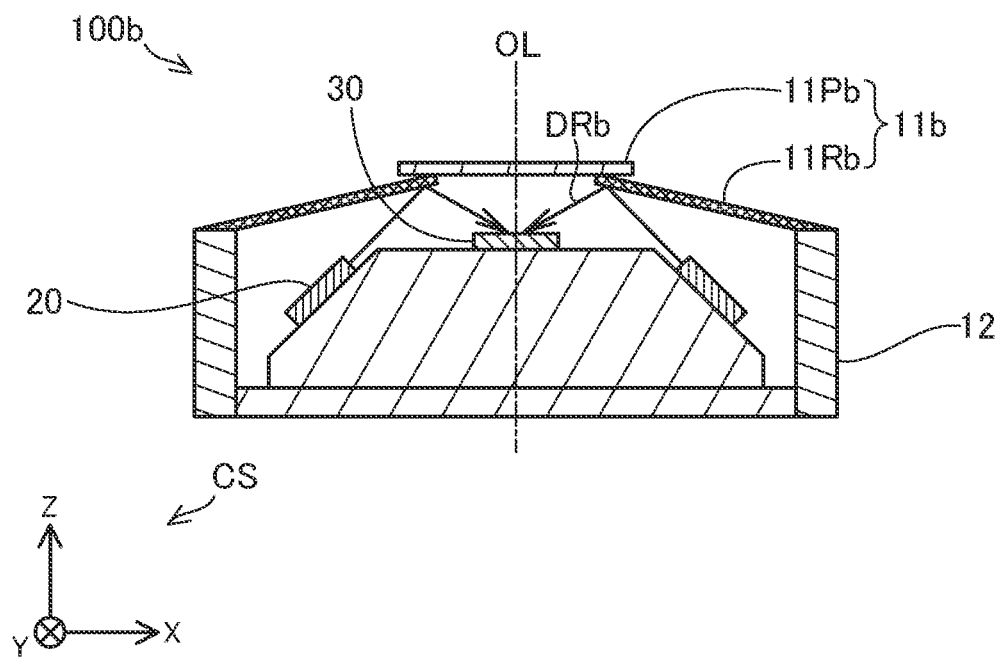
FIG. 5 is an explanatory view of a light-emitting apparatus according to a second modification of the first embodiment.

FIG. 5 is an explanatory view of a light-emitting apparatus 100b of a second modification of the first embodiment. The light-emitting apparatus 100b shown in FIG. 5 differs from the light-emitting apparatus 100 of the first embodiment in the point that the shape of a lid portion 11b differs from the shape of the lid portion 11 of the light-emitting apparatus 100. The light-emitting apparatus 100b is identical with the light-emitting apparatus 100 of the first embodiment in terms of other shapes, etc. Therefore, only shapes, etc. different from those of the first embodiment will be described, and shapes, etc. identical with those of the first embodiment will not be described repeatedly. FIG. 5 shows a schematic sectional view of the light-emitting apparatus 100b of the second modification which is taken along line B-B and corresponds to the schematic sectional view of FIG. 3 showing the cross section of the light-emitting apparatus 100.

As shown in FIG. 5, the lid portion 11b includes a metallic body (reflecting portion) 11Rb which is formed of Al and specularly reflects the light emitted from the light-emitting elements 20 and a transparent plate (transparent portion) 11Pb which is formed of borosilicate glass and through which the white light LT emitted from the fluorescent body 30 passes. The metallic body 11Rb is joined to the side wall portion 12 and inclines from the joint position such that the metallic member 11Rb ascends toward the positive direction side of the Z-axis as approaching the center axis OL. The transparent plate 11Pb is a rectangular plate-shaped member extending along the XY plane. In order to seal the space in which the light-emitting elements 20 are disposed, the transparent plate 11Pb is located on the center axis OL and joined to the metallic body 11Rb.

Since the metallic body 11Rb of the second modification of the first embodiment is formed of Al which is a metal, production is easy.

Third Modification of First Embodiment

Figure 6:
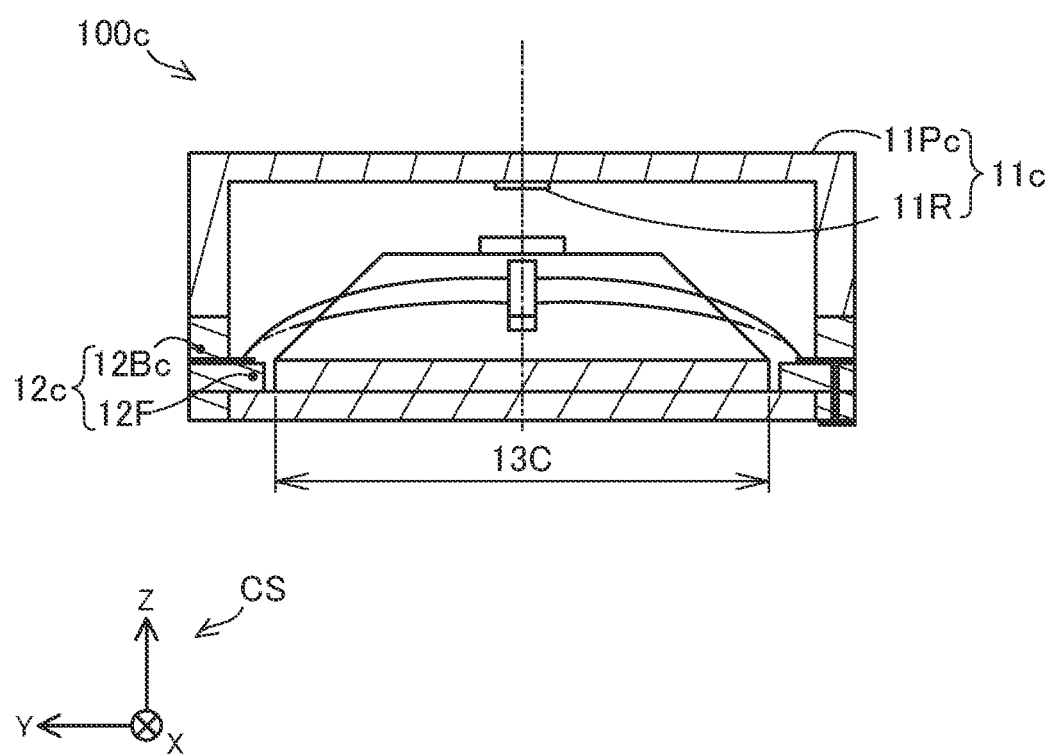
FIG. 6 is an explanatory view of a light-emitting apparatus according to a third modification of the first embodiment.
Figure 7:
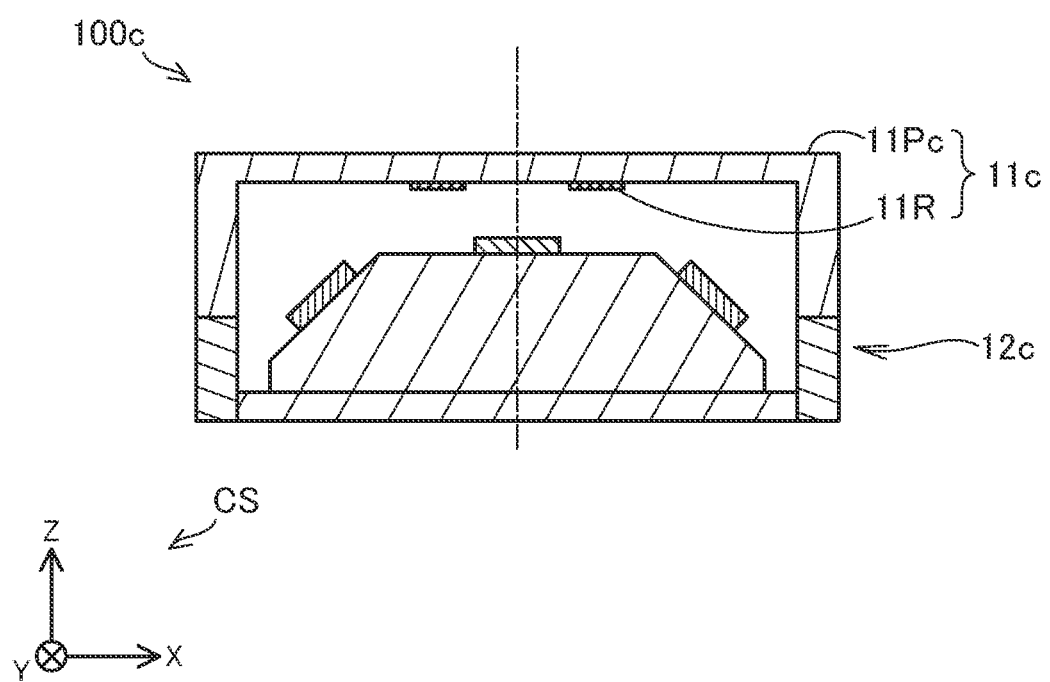
FIG. 7 is another explanatory view of the light-emitting apparatus according to the third modification of the first embodiment.

FIGS. 6 and 7 are explanatory views of a light-emitting apparatus 100c of a third modification of the first embodiment. The light-emitting apparatus 100c shown in FIGS. 6 and 7 differs from the light-emitting apparatus 100 of the first embodiment in the point that the shapes of a lid portion 11c and a side wall portion 12c differ from the shapes of the lid portion 11 and the side wall portion 12 of the light-emitting apparatus 100. The light-emitting apparatus 100c is identical with the light-emitting apparatus 100 of the first embodiment in terms of other shapes, etc. Therefore, only shapes, etc. different from those of the first embodiment will be described, and shapes, etc. identical with those of the first embodiment will not be described repeatedly. FIG. 6 shows a schematic sectional view of the light-emitting apparatus 100c of the third modification corresponding to the schematic sectional view of FIG. 2 showing the cross section of the light-emitting apparatus 100 taken along line A-A and viewed from the negative direction side of the X-axis. FIG. 7 shows a schematic sectional view of the light-emitting apparatus 100c of the third modification which is taken along line B-B and corresponds to the schematic sectional view of FIG. 3 showing the cross section of the light-emitting apparatus 100.

In the light-emitting apparatus 100c of the third modification, a portion which is formed by the side wall portion 12 in the first embodiment is formed as a part of the lid portion 11c. As shown in FIGS. 6 and 7, a plate-shaped member 11Pc of the lid portion 11c extends, at its peripheral edge, toward the negative direction side of the Z-axis. In consideration of this, the length of extension of a side wall main body portion 12Bc of the side wall portion 12c toward the positive direction side of the Z-axis is made shorter. As in the case of this third modification, the lid portion 11c joined to the side wall portion 12c may form a part of the side wall portion 12c.

Second Embodiment

Figure 8:
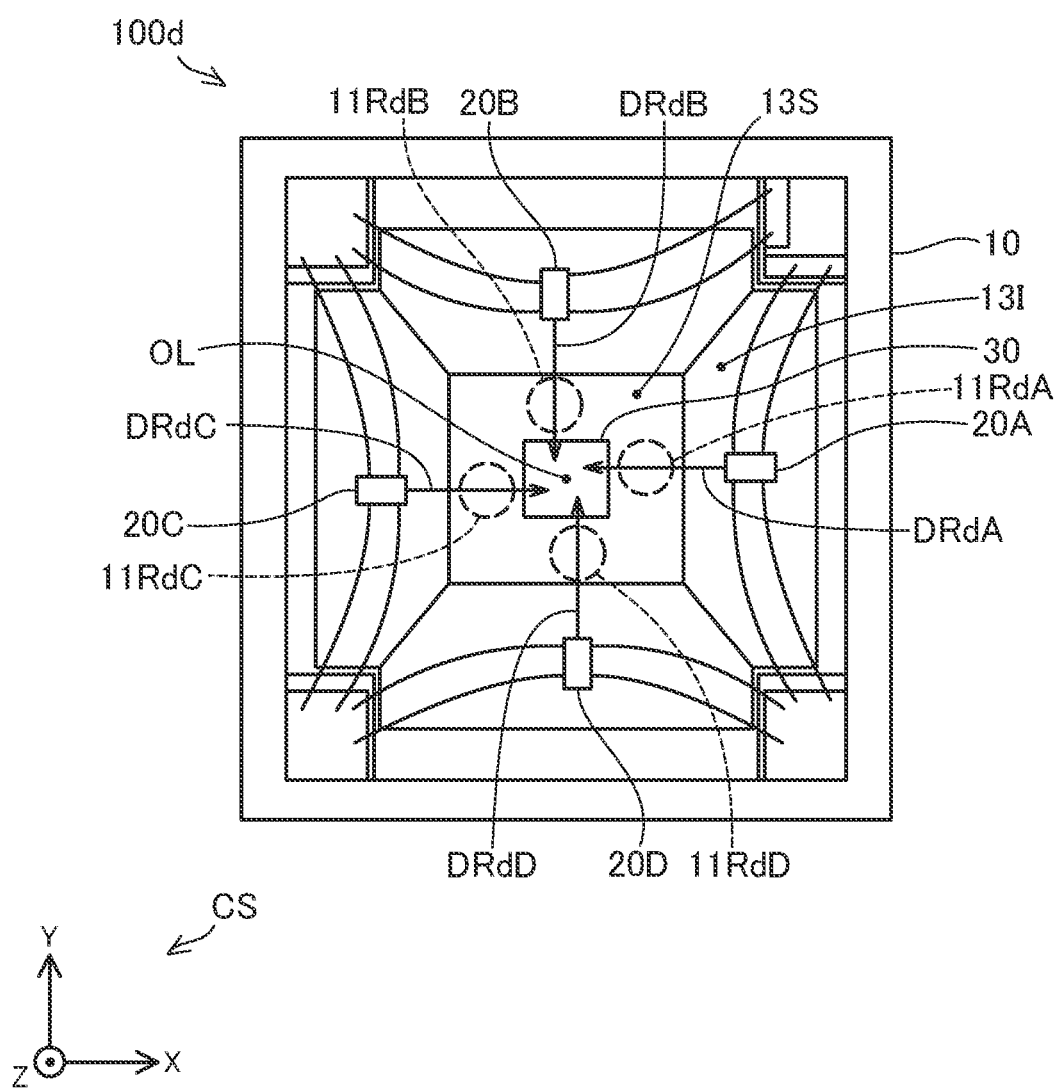
FIG. 8 is an explanatory view of a light-emitting apparatus according to a second embodiment.

FIG. 8 is an explanatory view of a light-emitting apparatus 100d of the second embodiment. The light-emitting apparatus 100d shown in FIG. 8 differs from the light-emitting apparatus 100 of the first embodiment in the number and arrangement of the light-emitting elements 20 and the number and arrangement of the film members 11R. The light-emitting apparatus 100d is identical with the light-emitting apparatus 100 of the first embodiment in terms of other configurations, etc. Therefore, in the second embodiment, only configurations, etc. different from those of the first embodiment will be described, and configurations, etc. identical with those of the first embodiment will not be described repeatedly. FIG. 8 shows a schematic top view of the light-emitting apparatus 100d of the second embodiment in a state in which its lid portion is removed as in the schematic top view of the light-emitting apparatus 100 of the first embodiment shown in FIG. 1.

As shown in FIG. 8, the light-emitting apparatus 100d of the second embodiment includes four light-emitting elements 20A to 20D and four film members 11RdA to 11RdD. The four light-emitting elements 20A to 20D are disposed on the sloping surfaces 131 of the bottom portion 13 at intervals of 90 degrees around the center axis OL. The four film members 11RdA to 11RdD are disposed on a surface of the plate-shaped member 11P (not shown in FIG. 8), the surface facing the bottom portion 13, at intervals of 90 degrees around the center axis OL.

As shown in FIG. 8, the positions of the light-emitting element 20A and the film member 11RdA are not symmetrical with the positions of the light-emitting element 20C and the film member 11RdC with respect to a YZ plane extending through the center axis OL. Similarly, the positions of the light-emitting element 20B and the film member 11RdB are not symmetrical with the positions of the light-emitting element 20D and the film member 11RdD with respect to a ZX plane extending through the center axis OL. In other words, as viewed from the lid portion side (the positive direction side of the Z-axis), the two light-emitting elements 20A and 20C (or the two light-emitting elements 20B and 20D) are disposed at positions between which the fluorescent body 30 is present. Moreover, the two light-emitting elements 20A and 20C (or the two light-emitting elements 20B and 20D) are disposed at positions determined such that optical axes DRdA and DRdC (or optical axes DRdB and DRdD), which are optical axes of light beams emitted from the two light-emitting elements 20A and 20C (or the two light-emitting elements 20B and 20D), do not overlap on the fluorescent body 30.

As described above, in the light-emitting apparatus 100d of the second embodiment, when viewed from the lid portion side, the two light-emitting elements 20A and 20C (or the two light-emitting elements 20B and 20D) are disposed in such a manner that the fluorescent body 30 is located between the light-emitting elements 20A and 20C (or the light-emitting elements 20B and 20D), and the optical axes DRdA and DRdC (or the optical axes DRdB and DRdD), which are the optical axes of the light beams emitted from the two light-emitting elements 20A and 20C (or the two light-emitting elements 20B and 20D), do not overlap. Therefore, in the light-emitting apparatus 100d of the second embodiment, the light beams emitted from the plurality of light-emitting elements 20A to 20D impinge on the fluorescent body 30 at different positions. Namely, since the light beams impinge on the fluorescent body 30 at dispersed positons, heat generation of the fluorescent body 30 due to incidence of light is suppressed. Since the fluorescent body 30 does not generate heat excessively, a decrease in the conversion efficiency of the fluorescent body 30 can be suppressed.

Third Embodiment

Figure 9:
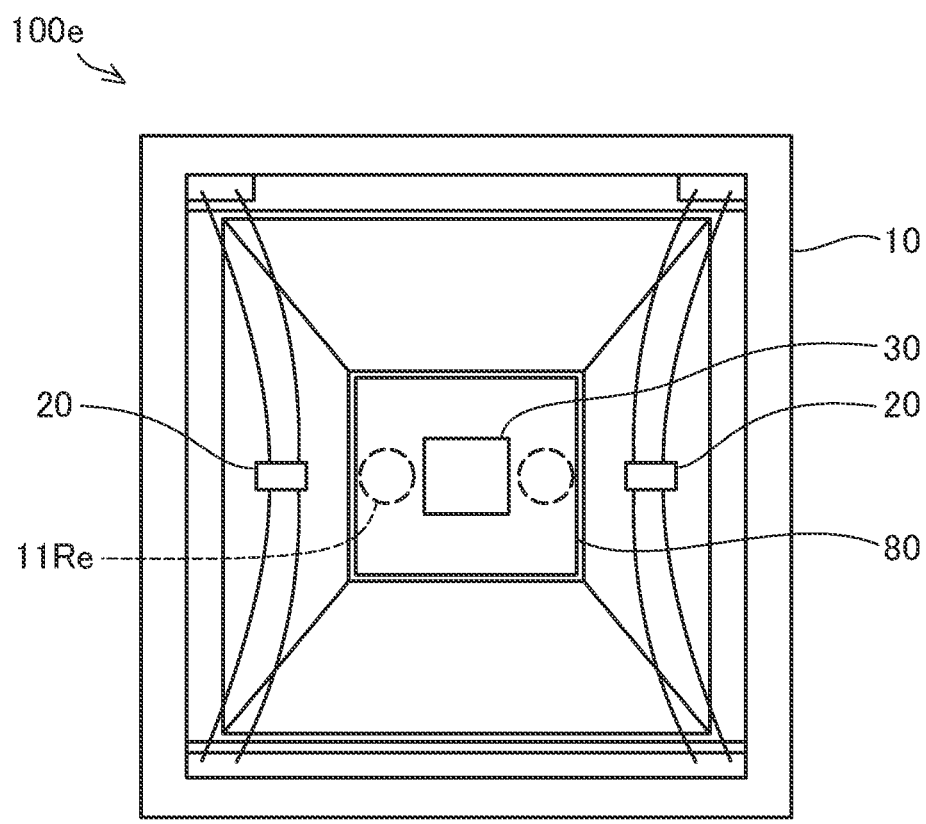
FIG. 9 is an explanatory view of a light-emitting apparatus according to a third embodiment.
Figure 9:
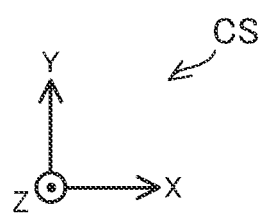
Figure 10:
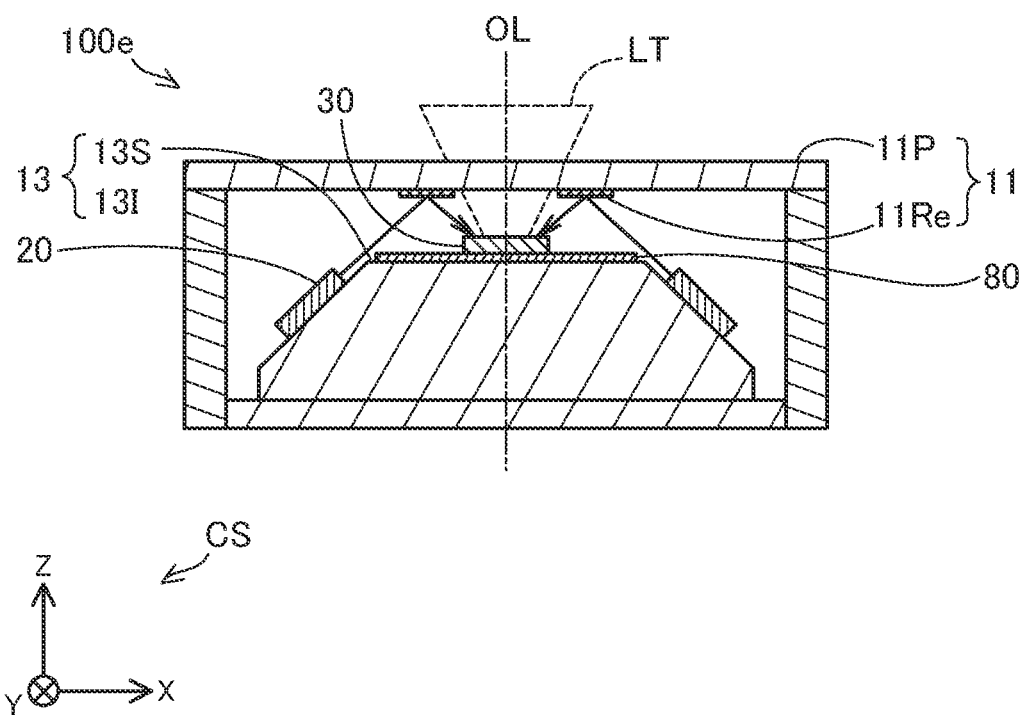
FIG. 10 is another explanatory view of the light-emitting apparatus according to the third embodiment.

FIGS. 9 and 10 are explanatory views of a light-emitting apparatus 100e of a third embodiment. The light-emitting apparatus 100e shown in FIGS. 9 and 10 differs from the light-emitting apparatus 100 of the first embodiment in the point that a reflection plate 80 is disposed on the top surface 13S of the bottom portion 13 and the material of film members 11Re differs from the material of the film members 11R. The light-emitting apparatus 100e is identical with the light-emitting apparatus 100 of the first embodiment in terms of other configurations flows, etc. Therefore, in the third embodiment, only configurations, etc. different from those of the first embodiment will be described, and configurations, etc. identical with those of the first embodiment will not be described repeatedly. FIG. 9 shows a schematic top view of the light-emitting apparatus 100e of the third embodiment in a state in which its lid portion is removed as in the schematic top view of the light-emitting apparatus 100 of the first embodiment shown in FIG. 1. FIG. 10 shows a schematic sectional view of the light-emitting apparatus 100e of the third embodiment which is taken along line B-B and corresponds to the schematic sectional view of FIG. 3 showing the cross section of the light-emitting apparatus 100.

As shown in FIGS. 9 and 10, in the light-emitting apparatus 100e of the third embodiment, the reflecting plate 80 formed of Al is disposed on the top surface 13S, and the fluorescent body 30 is disposed on the reflecting plate 80. As shown in FIG. 9, when viewed from the lid portion 11 side (the positive direction side of the Z-axis), the reflecting plate 80 has an area slightly smaller than the area of the top surface 13S and larger than the area of the fluorescent body 30. Also, the centroid of the top surface 13S, the centroid of the fluorescent body 30, and the centroid of the reflecting plate 80 are located on the center axis OL. As a result, when viewed from the lid portion 11 side, the reflecting plate 80 is disposed to surround the circumference of the fluorescent body 30. The reflecting plate 80 of the third embodiment specularly reflects incident light, like the film members 11R. The film members 11Re of the third embodiment are not formed of Al. Each of the film members 11Re is a multilayer film formed by depositing Cr (50 nm), Ni (100 nm), Ag (500 nm), $TiO_2$, and $SiO_2$ through pattern vapor deposition.

As described above, the light-emitting apparatus 100e of the third embodiment includes the reflecting plate 80 disposed on the top surface 13S of the bottom portion 13. The reflecting plate 80 is disposed to surround the circumference of the fluorescent body 30 when viewed from the lid portion 11 side. Therefore, in the light-emitting apparatus 100e of the third embodiment, even when the white light LT emitted from the fluorescent body 30 is reflected by the film members 11R toward the bottom portion 13 side (the negative direction side of the Z-axis), the white light LT is reflected again by the reflecting plate 80 toward the lid portion 11 side (the positive direction side of the Z-axis). As a result, the amount of the white light LT absorbed within the housing 10 decreases, and therefore, a decrease in output power of the light-emitting apparatus 100e is suppressed further.

Modifications of Embodiments

The present invention is not limited to the above-described embodiments and can be implemented in various forms without departing from the gist of the present invention. For example, the following modifications are possible.

In the above-described first to third embodiments, exemplary light-emitting apparatuses have been described. However, the configurations, shapes, etc. of the light-emitting apparatuses can be modified in various ways. The light-emitting apparatus 100 can be modified so long as the modified light-emitting apparatus includes a housing 10 which includes a bottom portion 13 having a top surface 13S and a sloping surface 131 and a lid portion 11 having a transparent portion and a reflecting portion; a light-emitting element 20 disposed on the sloping surface 131; and a wavelength conversion body disposed on the top surface 13S. For example, the light-emitting apparatus 100 is not required to include two or more light-emitting elements 20 and two or more film members 11R each serving as a reflecting portion, and the light-emitting apparatus 100 may include a single light-emitting element 20 and a single film member 11R.

The lid portion 11 is only required to have a transparent portion through which the light emitted from the fluorescent body 30 passes and a reflecting portion for specular reflection of the light emitted from the light-emitting elements 20. For example, the lid portion 11 may be composed of only a transparent portion and a reflecting portion or may include a different portion which provides a function other than the functions of the transparent portion and the reflecting portion. The film members 11R each functioning as a reflecting portion are not required to be a film-shaped member, and the shape and material of the film members 11R can be changed so long as the film members 11R can reflect the light emitted from the light-emitting elements 20.

Silver or dielectric multilayer film may be used as the material of the reflecting portion, and a material other than metal may be used. The transparent portion may have an uneven shape (i.e., may have concave and/or convex portions). In the first and second modifications of the first embodiment, the film members 11Ra, each serving as a reflecting portion, are formed on the plate-shaped member 11Pa sloping in relation to the XY plane, whereby the normal line NL of the reflecting surface of each film member 11Ra inclines to extend toward the fluorescent body 30. However, the configuration for inclining the normal line NL can be modified in various ways. For example, a film member whose thickness increases as departing from the center axis OL may be disposed, as a reflecting portion, on a horizontal plate-shaped member parallel to the XY plane. In this film member, the thickness on the center side and the thickness on the peripheral side differ from each other. As a result, the normal line NL of the reflecting surface of the film member inclines to extend toward the fluorescent body 30.

The material of the side wall portion 12 may be other than alumina and may be aluminum nitride (AlN), silicon carbide (SiC), or the like. It is preferred that the side wall portion 12 is formed of an insulating material. The bottom portion 13 may be formed of a material other than copper. For example, the bottom portion 13 may be formed of aluminum nitride, silicon carbide, aluminum, or diamond. Since the bottom portion 13 functions as a heat radiating portion, preferably, the heat conductivity of the bottom portion 13 is higher than those of the side wall portion 12 and the lid portion 11.

The wavelength conversion body is not limited to the YAG fluorescent body used in the embodiments, and a known wavelength conversion body may be employed. In the above-described first to third embodiments, the blue light emitted from the light-emitting elements 20 is converted to white light LT by the fluorescent body 30 serving as a wavelength conversion body. However, the combination of the light emitted from the light-emitting elements 20 and the light emitted from the wavelength conversion body as a result of conversion can be changed within the range of known techniques. Preferably, the positional relationship between the fluorescent body 30 and the reflecting portion (for example, the film member 11R) is determined such that, if the reflecting portion overlaps a part of the fluorescent body 30 when viewed from the lid portion side (the positive direction side of the Z-axis), the ratio of the area of the part to the area of the fluorescent body 30 is less than 50%.

In the above-described first to third embodiments, as viewed in the direction in which the bottom portion 13 and the lid portion 11 face each other (the direction of the Z axis), the fluorescent body 30 is disposed on the lid portion 11 side in relation to the light-emitting elements 20. However, the positional relationship between the fluorescent body 30 and the light-emitting elements 20 may be changed. For example, the light-emitting elements 20 may be disposed at positions closer to the lid portion 11 as compared with the positions shown in FIG. 2, so that a portion of each light-emitting element 20 is located on the lid portion 11 side in relation to the fluorescent body 30.

In the light-emitting apparatus 100d of the second embodiment shown in FIG. 8, when viewed from the lid portion side (the positive direction side of the Z-axis), the two light-emitting elements 20A and 20C are disposed at positions between which the fluorescent body 30 is present. Moreover, the two light-emitting elements 20A and 20C are disposed at positions determined such that the optical axes DRdA and DRdC of the light beams emitted from the two light-emitting elements 20A and 20C, respectively, do not overlap. However, the positional relationship between the light-emitting elements 20A and 20C may be changed. For example, the two light-emitting elements 20A and 20C may be disposed at positions which are symmetrical with respect to the YZ plane extending through the center axis OL, so that the optical axes DRdA and DRdC overlap each other on the fluorescent body 30. In the case where light beams are emitted from a plurality of light-emitting elements, preferably, overlapping of light beams impinging on the wavelength conversion body is 80% or less.

The reflecting plate 80 in the light-emitting apparatus 100e of the third embodiment shown in FIGS. 9 and 10 is a mere example and may be modified in various ways. The reflecting plate 80 is not necessarily required to be disposed around the fluorescent body 30 and may be disposed on a portion of the top surface 13S (for example, a portion on the Y-axis positive side of the fluorescent body 30). The reflecting plate 80 may be disposed on the sloping surface 131. The shape of the reflecting plate 80 is not limited to the rectangular plate shape and may be a circular plate shape.

Notably, in the orthogonal coordinate system CS composed of the X-axis, the Y-axis, and the Z-axis and shown in FIGS. 1, 3 to 5, and 7 to 9, the facing direction in which the lid portion 11 and the bottom portion 13 face each other is defined as the direction of the Z axis. Moreover, in the orthogonal coordinate system CS, axes which are parallel to mutually orthogonal sides of the rectangular light-emitting apparatus 100 on a plane perpendicular to the Z-axis are defined as the X-axis and the Y-axis. However, the orthogonal coordinate system CS is an example of a coordinate system set such that the lid portion 11 is located on the upper side. For example, in the case where the positive and negative sides in the direction of the Z axis are reversed, the positional relationship between the "lid portion 11" and the "bottom portion 13" may be reversed in the vertical direction, and setting of the coordinate axes may be modified.

Although the present aspects have been described on the basis of embodiments and modifications, the above-described embodiments of the aspects are provided so as to facilitate the understanding of the present aspects and do not limit the present aspects. The present aspects can be changed or improved without departing from the purpose and the scope of the claims, and encompasses equivalents thereof. Also, the technical feature(s) may be eliminated as appropriate unless the present specification mentions that the technical feature(s) is mandatory.

REFERENCE SIGNS LIST 10 a housing (light-emitting element housing)
11, 11a, 11B, 11c lid portion
11P, 11Pa, 11Pb, 11Pc plate-shaped member
11R, 11Ra, 11Rb, 11RdA, 11RdB, 11RdC, 11RdD, 11Re film members
12 side wall portion
12B, 12Bc, 12c side wall main body portion
12F flange portion
13 bottom portion
13O outer edge portion
13C central portion
131 sloping surfaces
13S flat top surface
20, 20A, 20B, 20C, 20D light-emitting elements
30 a fluorescent body (a wavelength conversion body)
41 first wiring conductor
42 via conductor
43 back side electrode
51 second wiring conductor
61 third wiring conductor
70 gold wire
80 reflection plate
100, 100a, 100b, 100c, 100d, 100e light-emitting apparatus
CS orthogonal coordinate system
DR, DRa, DRdA, DRdB, DRdC, DRdD optical axis
LT white light
NL normal line of a reflecting surface
OL center axis

What is claimed is:

1. A light-emitting apparatus comprising:
a housing having a bottom portion, a side wall portion connected to the bottom portion, and a lid portion connected to the side wall portion and facing the bottom portion;
a light-emitting element which emits light; and
a wavelength conversion body which converts a wavelength of the light emitted from the light-emitting element and emits light having a converted wavelength,
wherein the bottom portion has a central portion and an outer edge portion when viewed from a side where the lid portion is present, the central portion projecting toward the lid portion in relation to the outer edge portion,
the bottom portion has a flat top surface on the central portion, the top surface facing the lid portion, and
the bottom portion has a sloping surface around the top surface,
wherein the light-emitting element is disposed on the sloping surface, and the wavelength conversion body is disposed on the top surface and emits light toward the lid portion, and
wherein the lid portion has a transparent portion and a reflecting portion, the transparent portion being at least a part of a portion facing the wavelength conversion body and allowing the light emitted from the wavelength conversion body to pass through the transparent portion, the reflecting portion being a portion different from the transparent portion and specularly reflecting the light emitted from the light-emitting element so that the light impinges on the wavelength conversion body.

2. A light-emitting apparatus according to claim 1, wherein the lid portion includes a plate-shaped member which allows the light emitted from the wavelength conversion body to pass therethrough, and a film member provided on a surface of the plate-shaped member, the surface facing the wavelength conversion body, the film member specularly reflecting the light emitted from the light-emitting element, whereby a portion of the plate-shaped member where the film member is provided serves as the reflecting portion, and a portion of the plate-shaped member where the film member is not provided serves as the transparent portion.

3. A light-emitting apparatus according to claim 1, wherein, as viewed in a facing direction in which the bottom portion and the lid portion face each other, the wavelength conversion body is disposed on the side where the lid portion is present in relation to the light-emitting element.

4. A light-emitting apparatus according to claim 1, wherein
a plurality of light-emitting elements are disposed, and
at least two of the light-emitting elements are disposed in such a manner that, as viewed from the side where the lid portion is present, the wavelength conversion body is located between the two light-emitting elements, and optical axes of light beams emitted from the two light-emitting elements do not overlap on the wavelength conversion body.

5. A light-emitting apparatus according to claim 1, wherein a line normal to a reflecting surface of the reflecting portion inclines in relation to a facing direction, in which the bottom portion and the lid portion face each other, so that the line normal to the reflecting surface extends toward the wavelength conversion body.

6. A light-emitting apparatus according to claim 1, wherein the reflecting portion is formed of a metal.

7. A light-emitting apparatus according to claim 1, further comprising a reflecting plate disposed on the top surface of the bottom portion,
wherein, as viewed from the side where the lid portion is present, the reflecting plate is disposed to surround a circumference of the wavelength conversion body.

8. A light-emitting element housing for housing a light-emitting element which emits light, and a wavelength conversion body which converts a wavelength of the light emitted from the light-emitting element and emits light having a converted wavelength,
wherein the light-emitting element housing has a bottom portion, a side wall portion connected to the bottom portion, and a lid portion connected to the side wall portion and facing the bottom portion,
wherein the bottom portion has a central portion and an outer edge portion when viewed from a side where the lid portion is present, the central portion projecting toward the lid portion in relation to the outer edge portion,
the bottom portion has a flat top surface on the central portion, the top surface facing the lid portion,
the bottom portion has a sloping surface around the top surface,
the bottom portion has a light-emitting element disposing region on the sloping surface where the light-emitting element is disposed, and
the bottom portion has a wavelength conversion body disposing region on the top surface where the wavelength conversion body is disposed, and wherein the lid portion has a transparent portion and a reflecting portion, the transparent portion being at least a part of a portion facing the wavelength conversion body disposing region and allowing the light emitted from the wavelength conversion body disposed in the wavelength conversion body disposing region to pass through the transparent portion, the reflecting portion being a portion different from the transparent portion and specularly reflecting the light emitted from the light-emitting element disposed in the light-emitting element disposing region so that the light impinges on the wavelength conversion body disposed in the wavelength conversion body disposing region.

9. A light-emitting apparatus according to claim 2, wherein, as viewed in a facing direction in which the bottom portion and the lid portion face each other, the wavelength conversion body is disposed on the side where the lid portion is present in relation to the light-emitting element.

10. A light-emitting apparatus according to claim 2, wherein
a plurality of light-emitting elements are disposed, and
at least two of the light-emitting elements are disposed in such a manner that, as viewed from the side where the lid portion is present, the wavelength conversion body is located between the two light-emitting elements, and optical axes of light beams emitted from the two light-emitting elements do not overlap on the wavelength conversion body.

11. A light-emitting apparatus according to claim 2, wherein a line normal to a reflecting surface of the reflecting portion inclines in relation to a facing direction, in which the bottom portion and the lid portion face each other, so that the line normal to the reflecting surface extends toward the wavelength conversion body.

12. A light-emitting apparatus according to claim 2, wherein the reflecting portion is formed of a metal.

13. A light-emitting apparatus according to claim 2, further comprising a reflecting plate disposed on the top surface of the bottom portion,
wherein, as viewed from the side where the lid portion is present, the reflecting plate is disposed to surround a circumference of the wavelength conversion body.

14. A light-emitting apparatus according to claim 3, wherein
a plurality of light-emitting elements are disposed, and
at least two of the light-emitting elements are disposed in such a manner that, as viewed from the side where the lid portion is present, the wavelength conversion body is located between the two light-emitting elements, and optical axes of light beams emitted from the two light-emitting elements do not overlap on the wavelength conversion body.

15. A light-emitting apparatus according to claim 3, wherein a line normal to a reflecting surface of the reflecting portion inclines in relation to a facing direction, in which the bottom portion and the lid portion face each other, so that the line normal to the reflecting surface extends toward the wavelength conversion body.

16. A light-emitting apparatus according to claim 3, wherein the reflecting portion is formed of a metal.

17. A light-emitting apparatus according to claim 3, further comprising a reflecting plate disposed on the top surface of the bottom portion,
wherein, as viewed from the side where the lid portion is present, the reflecting plate is disposed to surround a circumference of the wavelength conversion body.

18. A light-emitting apparatus according to claim 4, wherein a line normal to a reflecting surface of the reflecting portion inclines in relation to a facing direction, in which the bottom portion and the lid portion face each other, so that the line normal to the reflecting surface extends toward the wavelength conversion body.

19. A light-emitting apparatus according to claim 4, wherein the reflecting portion is formed of a metal.

20. A light-emitting apparatus according to claim 4, further comprising a reflecting plate disposed on the top surface of the bottom portion,
wherein, as viewed from the side where the lid portion is present, the reflecting plate is disposed to surround a circumference of the wavelength conversion body.

* * * * *